United States Patent [19]

Fujii et al.

[11] Patent Number: 5,563,841
[45] Date of Patent: Oct. 8, 1996

[54] SEMICONDUCTOR MEMORY DEVICE HAVING REDUNDANT CIRCUIT

[75] Inventors: Atsushi Fujii; Yoshitaka Takahashi, both of Kawasaki, Japan

[73] Assignee: Fujitsu Limited, Kawasaki, Japan

[21] Appl. No.: 503,610

[22] Filed: Jul. 18, 1995

[30] Foreign Application Priority Data

Aug. 5, 1994 [JP] Japan .................................. 6-184945

[51] Int. Cl.$^6$ .................................................. G11C 13/00
[52] U.S. Cl. ...................... 365/230.03; 365/210; 365/226
[58] Field of Search ......................... 365/189.01, 189.02, 365/189.05, 189.09, 230.01, 230.03, 210, 226, 229

[56] References Cited

U.S. PATENT DOCUMENTS 5,245,582 9/1993 Kimura .................................... 365/229

Primary Examiner—Terrell W. Fears
Attorney, Agent, or Firm—Armstrong, Westerman, Hattori, McLeland & Naughton

[57] ABSTRACT

A semiconductor memory device includes a memory cell array divided into a first memory cell array for an upper address of an input address and a second memory cell array for a lower address of the input address, a redundant cell array storing correction data, a first sense amplifier provided with respect to the first memory cell array, a first column decoder provided with respect to the first memory cell array, a second sense amplifier provided with respect to the second memory cell array, and a second column decoder provided with respect to the second memory cell array. The second sense amplifier and the second column decoder are non-selected when an access is made to the first memory cell array by the input address. The non-selected second sense amplifier and second column decoder operate as a sense amplifier and a column decoder provided with respect to the redundant cell array to thereby output the correction data from the upper address of the redundant cell array.

10 Claims, 9 Drawing Sheets

SEMICONDUCTOR MEMORY DEVICE HAVING REDUNDANT CIRCUIT

BACKGROUND OF THE INVENTION

The present invention generally relates to semiconductor memory devices, and more particularly to a semiconductor memory device having a redundant circuit.

Recently, the memory capacity of semiconductor memory devices have increased considerably, and in order to improve the production yield of mask read only memories (ROMs), for example, a redundant circuit is provided in the semiconductor memory device. In the redundant circuit, redundant cells for storing correction data are provided in addition to normal memory cells, and defective cells are compensated by the redundant cells.

FIG. 1 is a plan view showing a general mask ROM. In a mask ROM 100 shown in FIG. 1, a memory cell array, a column decoder, a row decoder, a sense amplifier and the like are provided in an element region 101. A part 102 of the element region 101 is shown on an enlarged scale in FIG. 2 in the form of a block diagram.

In FIG. 2, the part 102 generally includes a circuit portion 111 provided with respect to an upper address, and a circuit portion 112 provided with respect to a lower address. In other words, since the memory capacity of this mask ROM 100 is large, the memory cell array is divided into upper address memory cells for the upper address and lower address memory cells for the lower address. Accordingly, if an input address is greater than a predetermined value, for example, an access is made to the upper address memory cells from the circuit portion 111. In this example, the mask ROM 100 employs a 16-bit parity system.

The circuit portion 111 includes upper address memory cell arrays 01H and 05H, a sense amplifier 111-1 provided with respect to the memory cell array 01H, a column decoder 111-2 provided with respect to the memory cell array 01H, a sense amplifier 111-3 provided with respect to the memory cell array 05H, a column decoder 111-4 provided with respect to the memory cell array 05H, a redundant cell array 111-5 for storing correction data for the upper address, a sense amplifier 111-6 provided with respect to the redundant cell array 111-5, a column decoder 111-7 provided with respect to the redundant cell array 111-5, a row decoder 111-8 provided with respect to the memory cell array 01H, a row decoder 111-9 provided with respect to the memory cell array 05H, and a row decoder 111-10 provided with respect to the redundant cell array 111-5.

Similarly, the circuit portion 112 includes lower address memory cell arrays 01L and 05L, a sense amplifier 112-1 provided with respect to the memory cell array 05L, a column decoder 112-2 provided with respect to the memory cell array 05L, a sense amplifier 112-3 provided with respect to the memory cell array 01L, a column decoder 112-4 provided with respect to the memory cell array 01L, a redundant cell array 112-5 for storing correction data for the lower address, a sense amplifier 112-6 provided with respect to the redundant cell array 112-5, a column decoder 112-7 provided with respect to the redundant cell array 112-5, a row decoder 112-8 provided with respect to the memory cell array 05L, a row decoder 112-9 provided with respect to the memory cell array 01L, and a row decoder 112-10 provided with respect to the redundant cell array 112-5.

In FIG. 2, BL denotes a bit line, WDXX denotes a word system input, RDECOX through RDEC2X denote row decoder selection lines, BSBXX denotes a block system input, BLC denotes a bit line exclusively for correction data, and RDSC denotes a row decoder selection line exclusively for the correction data.

However, according to the structure shown in FIG. 2, the sense amplifier 111-6, the column decoder 111-7 and the row decoder 111-10 are provided exclusively with respect to the redundant cell array 111-5. Similarly, the sense amplifier 112-6, the column decoder 112-7 and the row decoder 112-10 are provided exclusively with respect to the redundant cell array 112-5. In addition, the bit lines BLC and the row decoder selection lines RDSC exclusively for the correction data are provided with respect to the redundant cell arrays 111-5 and 112-5.

For this reason, the sense amplifiers 111-6 and 112-6, the column decoders 111-7 and 112-7, the row decoders 111-10 and 112-10, the bit lines BLC and the row decoder selection lines RDSC which are provided exclusively with respect to the redundant cell arrays 111-5 and 112-5 occupy a relatively large area on the element region 101 shown in FIG. 1, thereby preventing further improvement in the integration density of the mask ROM 100. In other words, when increasing the memory capacity of the mask ROM, it is essential to provide redundant cells in order to improve the production yield, however, it becomes necessary to provide circuits such as sense amplifiers and column decoders exclusively for the redundant cells, and consequently, there was a limit to improving the integration density of the mask ROM.

On the other hand, because the sense amplifiers 111-6 and 112-6, the column decoders 111-7 and 112-7, and the row decoders 111-10 and 112-10 are provided exclusively with respect to the redundant cell arrays 111-5 and 112-5, the power consumption of these parts and the power consumption of a drive and control system for driving and controlling these parts are added to the total power consumption of the mask ROM 100. Therefore, there was a limit to reducing the power consumption of the mask ROM.

SUMMARY OF THE INVENTION

Accordingly, it is a general object of the present invention to provide a novel and useful semiconductor memory device in which the problems described above are eliminated.

Another and more specific object of the present invention is to provide a semiconductor memory device comprising a memory cell array divided into a first memory cell array for an upper address of an input address and a second memory cell array for a lower address of the input address, a redundant cell array storing correction data, a first sense amplifier provided with respect to the first memory cell array, a first column decoder provided with respect to the first memory cell array, a second sense amplifier provided with respect to the second memory cell array, and a second column decoder provided with respect to the second memory cell array, where the second sense amplifier and the second column decoder are nonselected when an access is made to the first memory cell array by the input address, and the non-selected second sense amplifier and second column decoder operate as a sense amplifier and a column decoder provided with respect to the redundant cell array to thereby output the correction data from the upper address of the redundant cell array. According to the semiconductor memory device of the present invention, the sense amplifier and the column decoder provided with respect to the non-selected one of the first and second memory cell arrays are used in common as the sense amplifier and the column decoder provided with respect to the redundant cell array.

For this reason, it is unnecessary to provide a sense amplifier and a column decoder exclusively for the redundant cell array, and the area on the element region that would be occupied by such exclusive parts of the redundant cell array is eliminated, thereby improving the integration density of the semiconductor memory device. In addition, since no sense amplifier and no column decoder are provided exclusively with respect to the redundant cell array, it is possible to reduce the power consumption by an amount that would otherwise be required in the conventional case if a drive and control system were to drive and control such exclusive parts of the redundant cell array. Therefore, the power consumption of the semiconductor memory device as a whole can be reduced compared to the conventional case.

Other objects and further features of the present invention will be apparent from the following detailed description when read in conjunction with the accompanying drawings.

DESCRIPTION OF THE PREFERRED EMBODIMENTS

Figure 1:
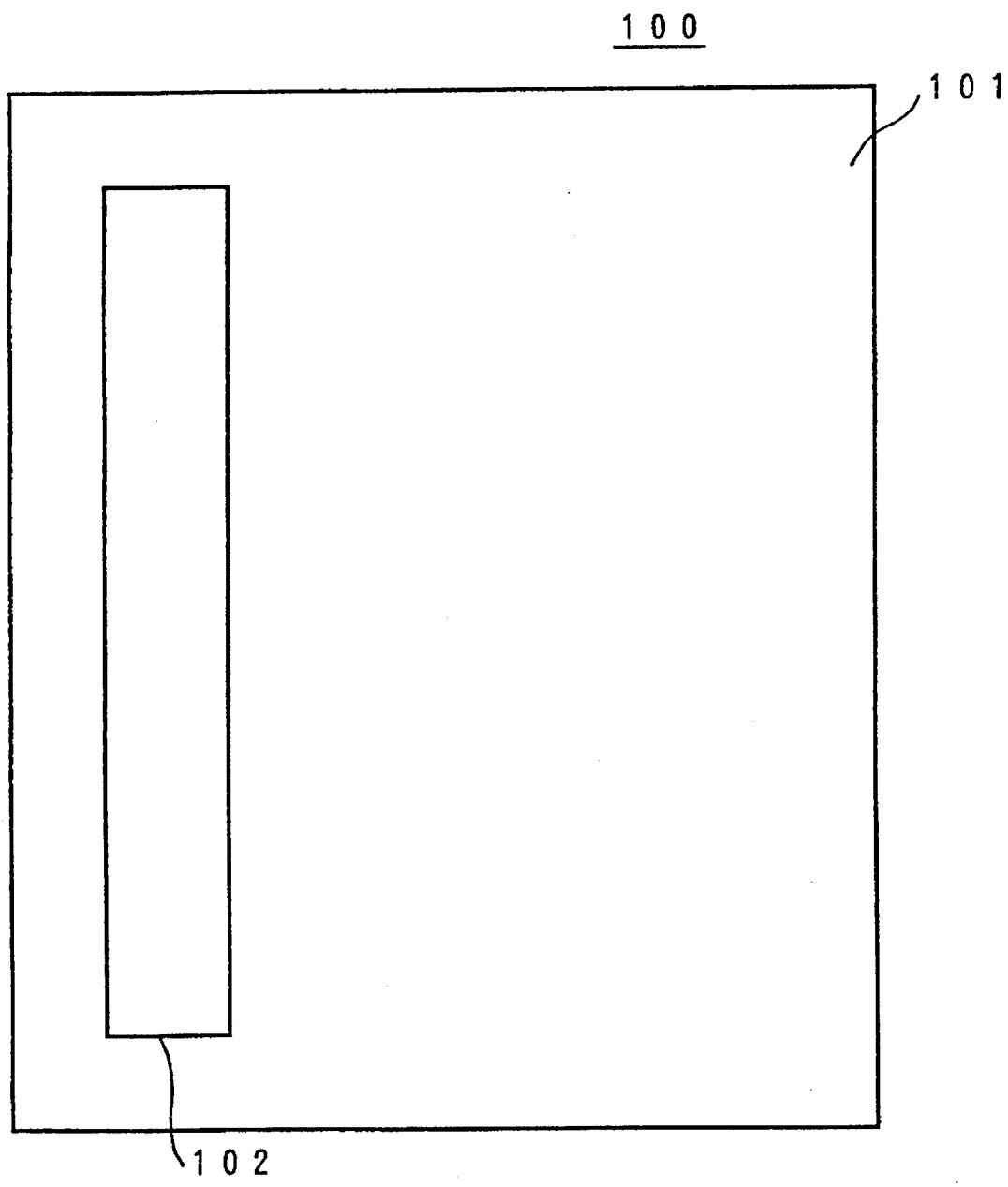
FIG. 1 is a plan view showing general mask ROM.
Figure 2:
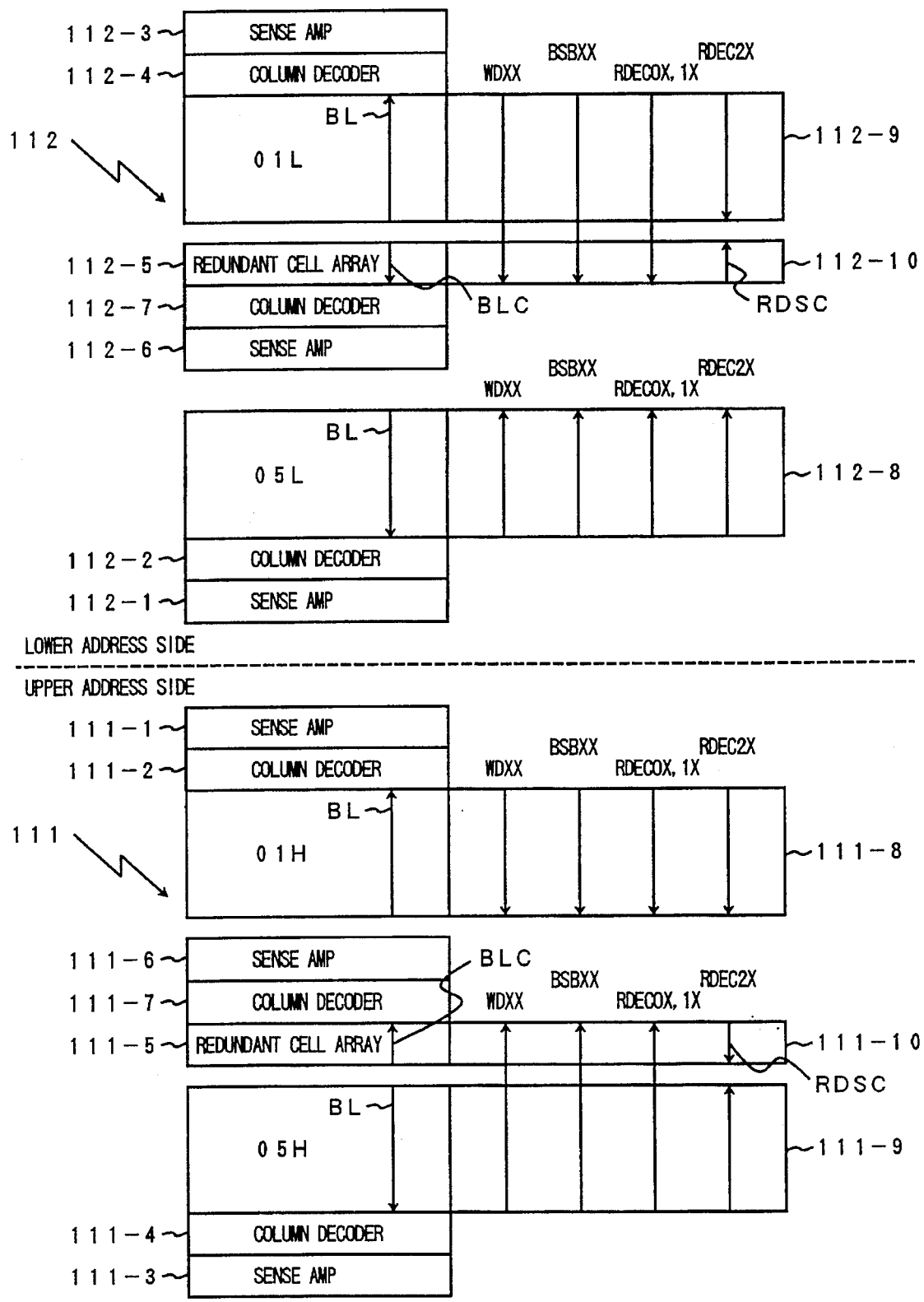
FIG. 2 is a block diagram showing a part of the mask ROM shown in FIG. 1 on an enlarged scale.
Figure 3:
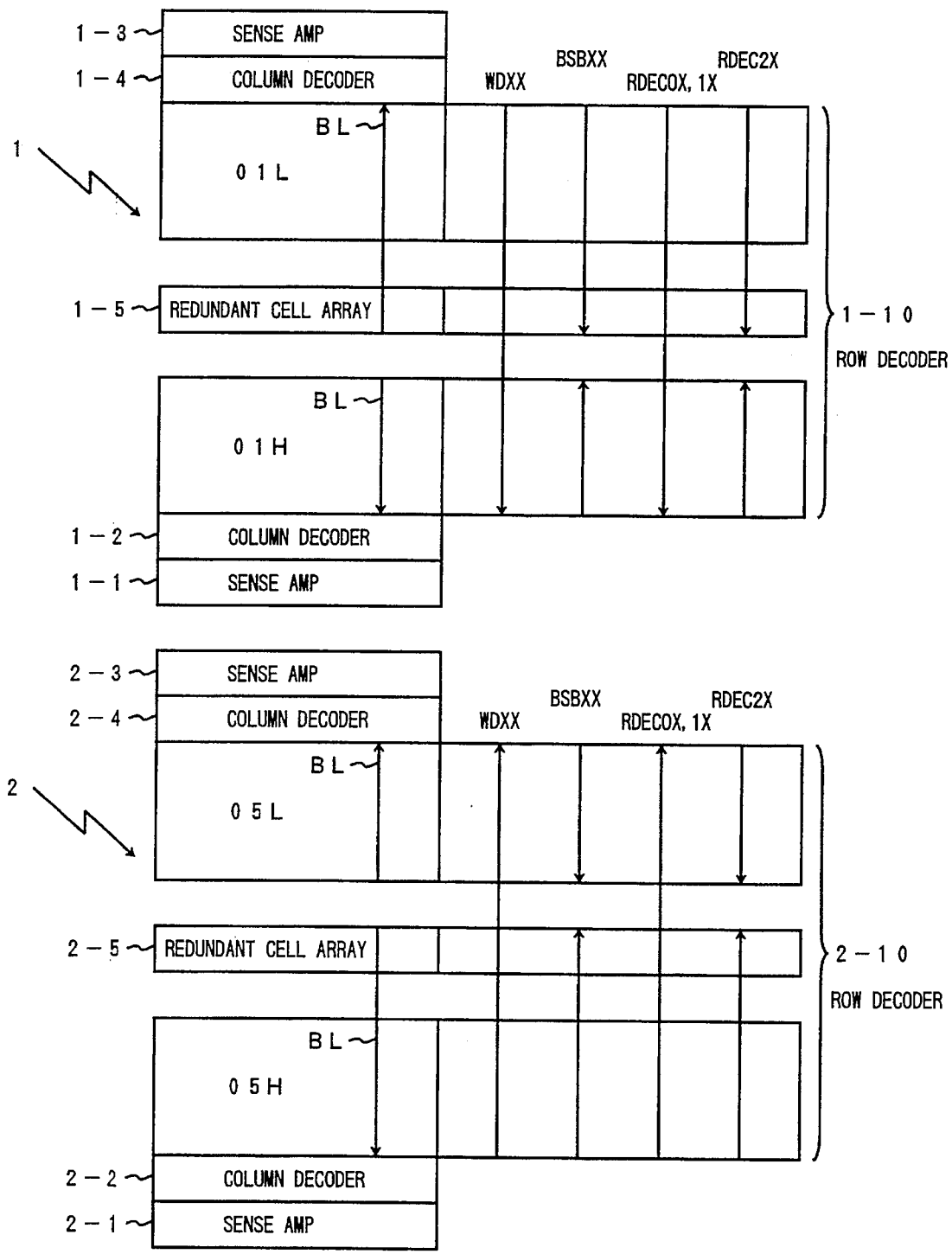
FIG. 3 is a block diagram showing a part of an embodiment of a semiconductor memory device according to the present invention.

FIG. 3 is a block diagram showing a part of an embodiment of the semiconductor device according to the present invention. In this embodiment, the present invention is applied to a mask ROM. For the sake of convenience, it is assumed that a circuit part show in FIG. 3 corresponds to the part 102 of the mask ROM 100 shown in FIG. 1.

The circuit part shown in FIG. 3 generally includes a circuit part 1 and a circuit part 2. Because the memory capacity of this mask ROM is large, the memory cell array is divided into upper address memory cells and lower address memory cells. Hence, if an input address is greater than a predetermined value, for example, an access is made to the upper address memory cells. In addition, it is assumed that the 16-bit parity system is employed in this embodiment.

The circuit part 1 includes an upper address memory cell array 01H, a lower address memory cell array 01L, a sense amplifier 1-1 provided with respect to the memory cell array 01H, a column decoder 1-2 provided with respect to the memory cell array 01H, a sense amplifier 1-3 provided with respect to the memory cell array 01L, a column decoder 1-4 provided with respect to the memory cell array 01L, a redundant cell array 1-5 for storing upper address correction data, and a row decoder 1-10. When the memory cell arrays 01H and 01L are respectively taken as 1 block (faces or fields), there actually are 32 blocks (faces or fields) of memory cell arrays in the mask ROM.

Similarly, the circuit part 2 includes an upper address memory cell array 05H, a lower address memory cell array 05L, a sense amplifier 2-1 provided with respect to the memory cell array 05H, a column decoder 2-2 provided with respect to the memory cell array 05H, a sense amplifier 2-3 provided with respect to the memory cell array 05L, a column decoder 2-4 provided with respect to the memory cell array 05L, a redundant cell array 2-5 for storing lower address correction data, and a row decoder 2-10.

In FIG. 3, BL denotes a bit line, WDXX denotes a word system input, RDECOX through RDEC2X denote row decoder selection lines, and BSBXX denotes a block system input. In the circuit part 1, the word system input WDXX and the row decoder selection lines RDECOX and RDEC1X are provided in common with respect to the memory cell arrays 01H and 01L and the redundant cell array 1-5. The block system input BSBXX and the row decoder selection line RDEC2X are independently provided with respect to only the memory cell array 01H and with respect to both the memory cell array 01L and the redundant cell array 1-5. In addition, the bit line BL is independently provided with respect to only the memory cell array 01H and in common with respect to both the memory cell array 01L and the redundant cell array 1-5. The circuit part 2 has a construction similar to that of the circuit part 1, and a description thereof will be omitted.

If the input address specifies a memory cell within the memory cell arrays 01H and 01L and is greater than a predetermined value, the circuit part 1 makes access to a memory cell within the upper address memory cell array 01H. In other words, in this case, only the sense amplifier 1-1 and the column decoder 1-2 which are provided with respect to the selected memory cell array 01H operate, and the sense amplifier 1-3 and the column decoder 1-4 which are provided with respect to the non-selected memory cell array 01L do not operate. Hence, in this embodiment, the sense amplifier 1-3 and the column decoder 1-4 which are originally not used in this state are used as a sense amplifier and a column decoder with respect to the redundant cell array 1-5.

In this embodiment, out of the sense amplifier 1-1 and the column decoder 1-2 which are provided with respect to the upper address memory cell array 01H and the sense amplifier 1-3 and the column decoder 1-4 which are provided with respect to the lower address memory cell array 01L, the sense amplifier 1-3 and the column decoder 1-4 provided with respect to the non-selected memory cell array 01L are used as the sense amplifier and the column decoder with respect to the redundant cell array 1-5.

Accordingly, the sense amplifier 1-3 and the column decoder 1-4 which are provided with respect to the non-selected lower address memory cell array 01L are used in common with the redundant cell array 1-5 and the non-selected memory cell array 01L. As a result, it is unnecessary to provide a sense amplifier and a column decoder exclusively for the redundant cell array 1-5.

Similarly, if the input address specifies a memory cell within the memory cell arrays 05H and 05L and is less than or equal to a predetermined value, the circuit part 2 makes access to a memory cell within the lower address memory cell array 05L. In other words, in this case, only the sense amplifier 2-3 and the column decoder 2-4 which are provided with respect to the selected memory cell array 05L operate, and the sense amplifier 2-1 and the column decoder 2-2 which are provided with respect to the non-selected memory cell array 05H do not operate. Hence, in this embodiment, the sense amplifier 2-1 and the column decoder 2-2 which are originally not used in this state are used as a sense amplifier and a column decoder with respect to the redundant cell array 2-5.

In this embodiment, out of the sense amplifier 2-1 and the column decoder 2-2 which are provided with respect to the upper address memory cell array 05H and the sense amplifier 2-3 and the column decoder 2-4 which are provided with respect to the lower address memory cell array 05L, the sense amplifier 2-1 and the column decoder 2-2 provided with respect to the non-selected memory cell array 05H are used as the sense amplifier and the column decoder with respect to the redundant cell array 2-5.

Accordingly, the sense amplifier 2-1 and the column decoder 2-2 which are provided with respect to the non-selected upper address memory cell array 05H are used in common with the redundant cell array 2-5 and the non-selected memory cell array 05H. As a result, it is unnecessary to provide a sense amplifier and a column decoder exclusively for the redundant cell array 2-5.

In the actual mask ROM, a large number of circuit parts such as the circuit parts 1 and 2 shown in FIG. 3 are provided. Hence, by not providing the sense amplifiers and the column decoders exclusively for the redundant cell arrays 1-5 and 2-5, it is possible to considerably eliminate the area on the element region that would be occupied by these exclusive sense amplifiers and column decoders. As a result, it is possible to improve the integration density of the mask ROM. In addition, with respect to the redundant cell arrays such as the redundant cell arrays 1-5 and 2-5, it is unnecessary to provide row decoder selection lines and bit lines exclusively for the correction data, and it is possible to use in common the row decoder selection lines and the bit lines provided with respect to the memory cell arrays such as the memory cell arrays 01L and 05H. Therefore, it is also possible to improve the integration density of the mask ROM from this point of view in that complex wiring becomes unnecessary.

Furthermore, compared to the conventional case, the elimination of the sense amplifiers and the column decoders exclusively for the redundant cell arrays 1-5 and 2-5 enables reduction in the power consumption of the drive and control system which would otherwise drive and controls these exclusive parts. As a result, it is possible to reduce the power consumption of the mask ROM as a whole.

Figure 4:
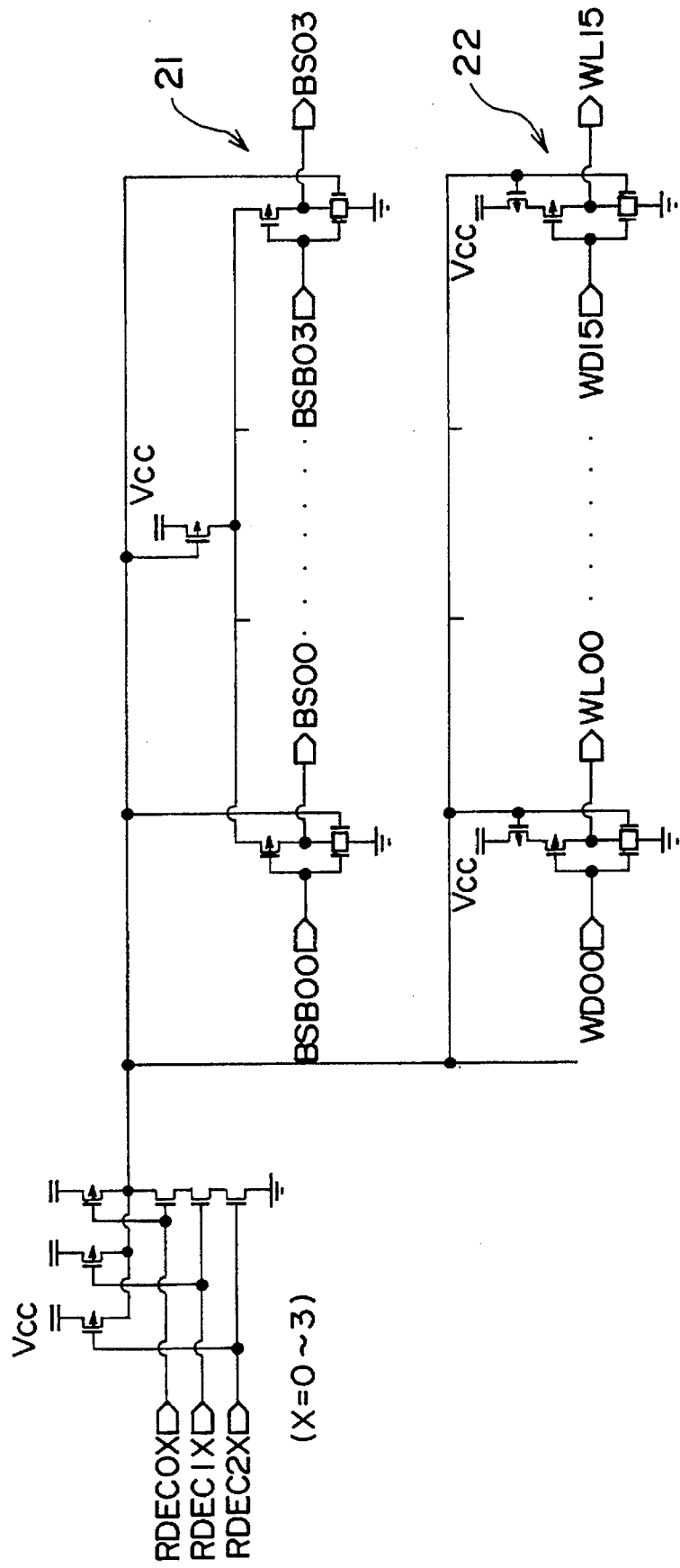
FIG. 4 is a circuit diagram showing a part of a row decoder shown in FIG. 3.

FIG. 4 is a circuit diagram showing a part of the row decoders 1-10 and 2-10 shown in FIG. 3. For the sake of convenience, it is assumed that FIG. 4 shows the row decoder 1-10.

In FIG. 4, Vcc denotes a power supply voltage, RDECOX through RDEC2X denote row decoder selection lines (RDECXX in FIG. 3), BSB00 through BSB03 denote block system inputs, WD00 through WD15 denote word system inputs (WDXX in FIG. 3), BS00 through BS03 denote block selection lines, and WL00 through WL15 denote word selection lines. The row decoder 1-10 shown in FIG. 4 includes a circuit part 21 having a construction shown and supplied with the block system inputs BSB00 through BSB03, and a circuit part 22 having a construction shown and supplied with the word system inputs WD00 through WD15.

Figure 5:
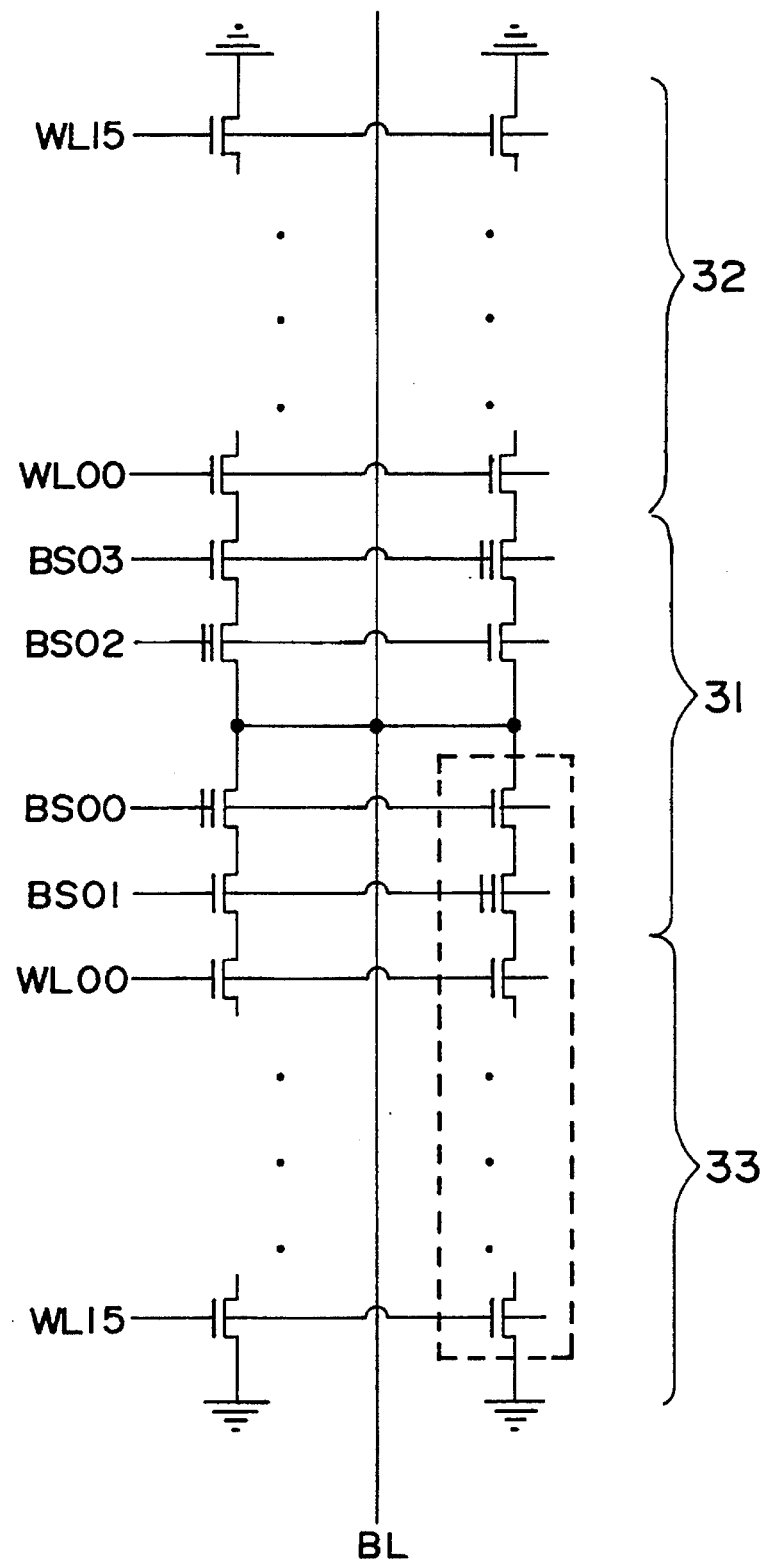
FIG. 5 is a circuit diagram showing a part of a memory cell array shown in FIG. 3.

FIG. 5 is a circuit diagram showing a part of the memory cell array 01H, 01L, 05H and 05L shown in FIG. 3. For the sake of convenience, it is assumed that FIG. 5 shows the memory cell array 01H.

In FIG. 5, the memory cell array 01H includes a circuit part 31 which is provided with respect to the block selection lines BS00 through BS03, and circuit parts 32 and 33 which are provided with respect to the word selection lines WL00 through WL15. The circuit part 31 includes depletion type transistors and enhancement type transistors which are connected as shown in FIG. 5. For example, if the logic level of the block selection line BS00 has a high level, a block indicated by a dotted line in FIG. 5 is selected. In FIG. 5, BL denotes a bit line.

Figure 6:
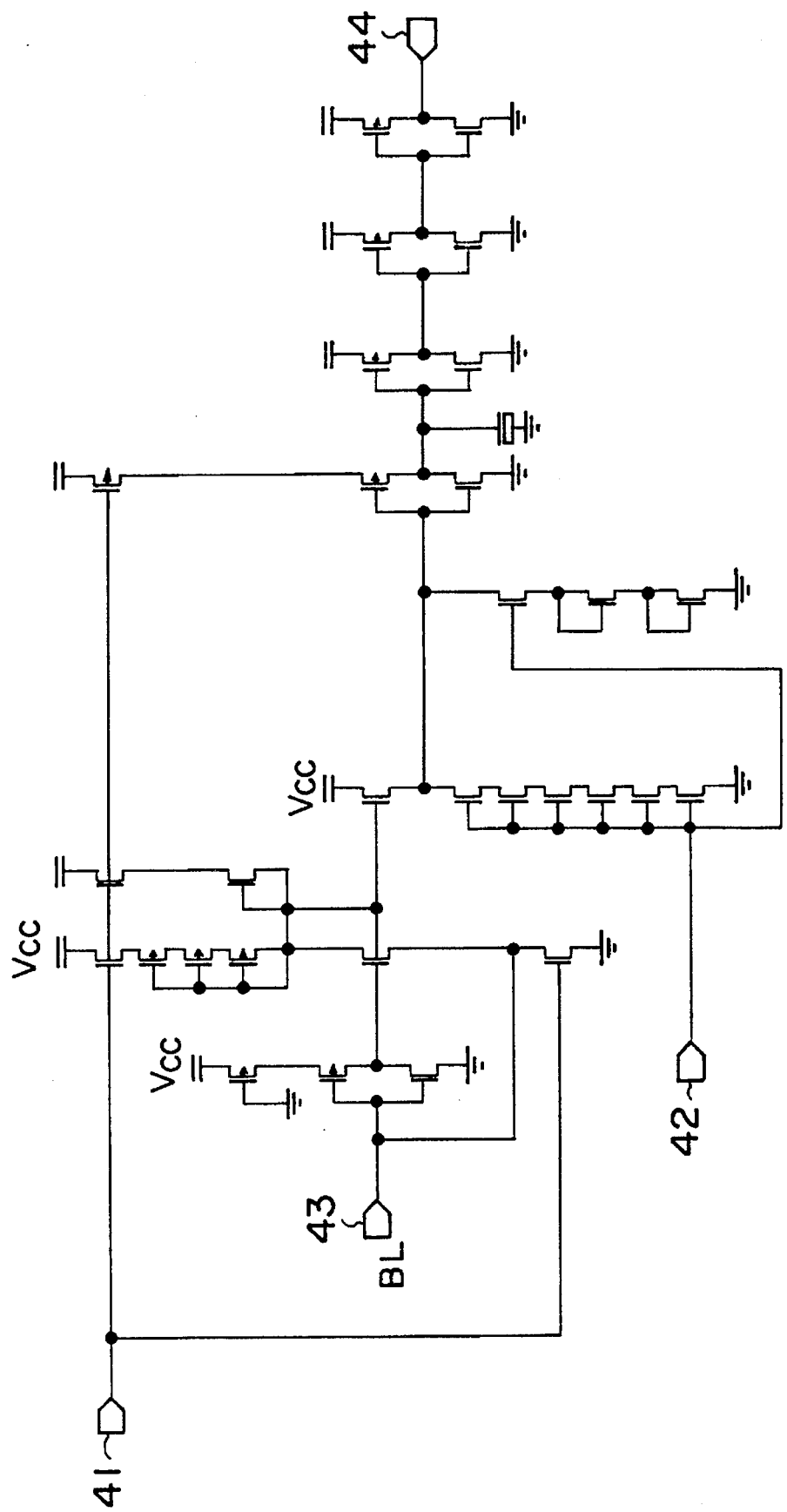
FIG. 6 is a circuit diagram showing a part of one sense amplifier shown in FIG. 3.

FIG. 6 is a circuit diagram showing a part of the sense amplifiers 1-1 and 2-3 shown in FIG. 3. For the sake of convenience sake, it is assumed that FIG. 6 shows the sense amplifier 1-1.

In FIG. 6, the sense amplifier 1-1 includes transistors which are connected as shown. An inverted sense amplifier enable signal /CE is input to a terminal 41, and a sense amplifier enable signal CE is input to a terminal 42. A signal from a corresponding bit line BL is input to a terminal 43. Data from the memory cell array 01H that is obtained by detecting and amplifying the potential of the corresponding bit line BL is output from a terminal 44. This sense amplifier 1-1 operates (that is, active) when the inverted sense amplifier enable signal /CE has a low level and the sense amplifier enable signal CE has a high level. When the inverted sense amplifier enable signal /CE has a high level and the sense amplifier enable signal CE has a low level, the sense amplifier 1-1 does not operate (that is, inactive), and a high-level signal is output from the terminal 44.

Figure 7:
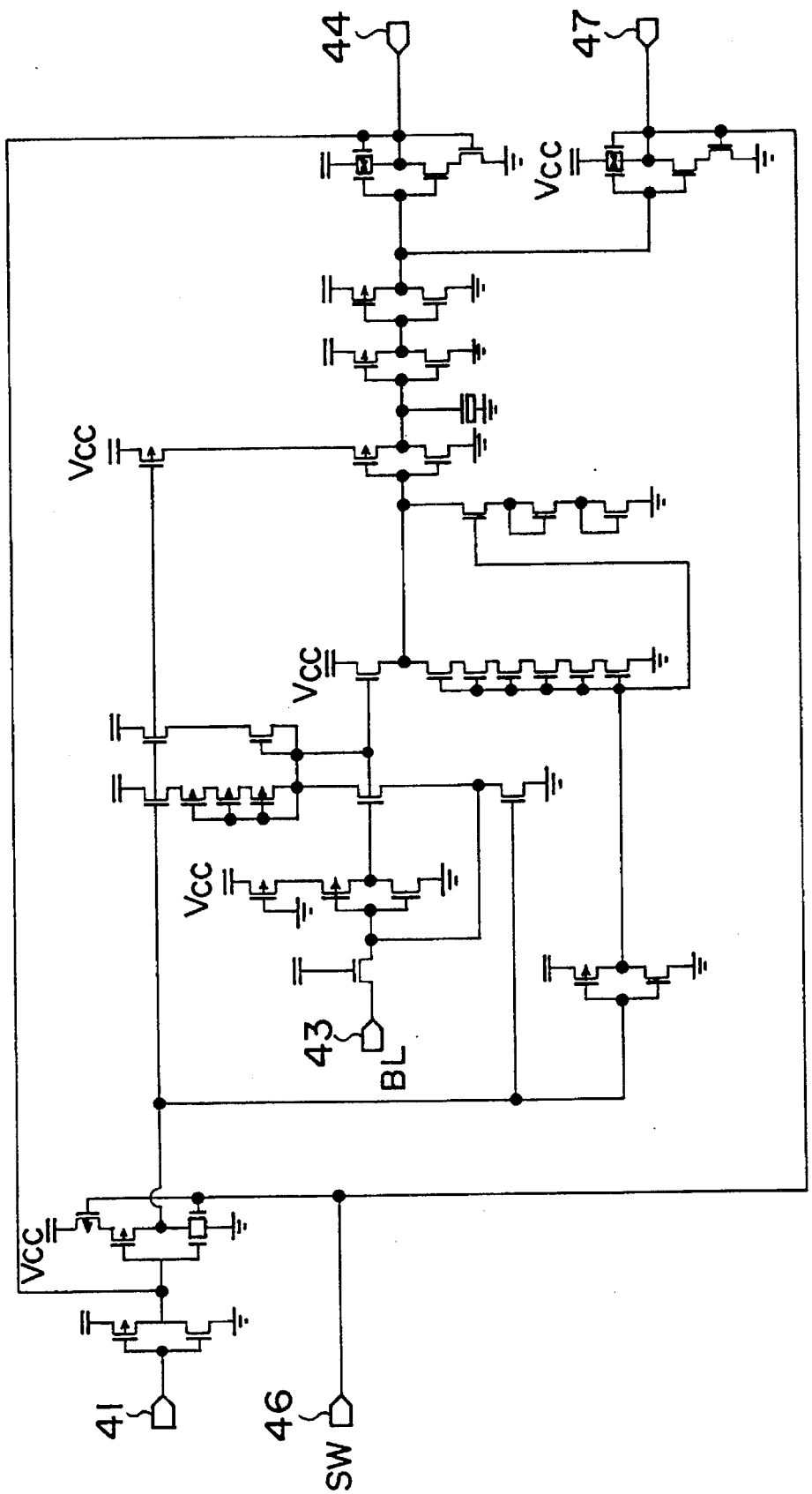
FIG. 7 is a circuit diagram showing a part of another sense amplifier shown in FIG. 3.

FIG. 7 is a circuit diagram showing a part of the sense amplifiers 1-3 and 2-1 shown in FIG. 3. For the sake of convenience, it is assumed that FIG. 7 shows the sense amplifier 1-3. In FIG. 7, those parts which are the same as those corresponding parts in FIG. 6 are designated by the same reference numerals.

The sense amplifier 1-3 shown in FIG. 7 may sense the regular data from the memory cell array 01L or sense the correction data from the redundant cell array 1-5. Hence, an output of this sense amplifier 1-3 is switched depending on whether the data from the corresponding bit line BL is the regular data or the correction data.

In other words, the sense amplifier 1-3 shown in FIG. 7 includes transistors which are connected as shown, and the inverted sense amplifier enable signal /CE is input to the terminal 41, while a switching signal SW which will be described later is input to a terminal 46. The signal from the corresponding bit line BL is input to the terminal 43. The regular data from the memory cell array 01L obtained by detecting and amplifying the potential of the corresponding bit line BL is output from the terminal 44. On the other hand, the correction data from the redundant cell array 1-5 obtained by detecting and amplifying the potential of the corresponding bit line BL is output from a terminal 47.

Figure 8:
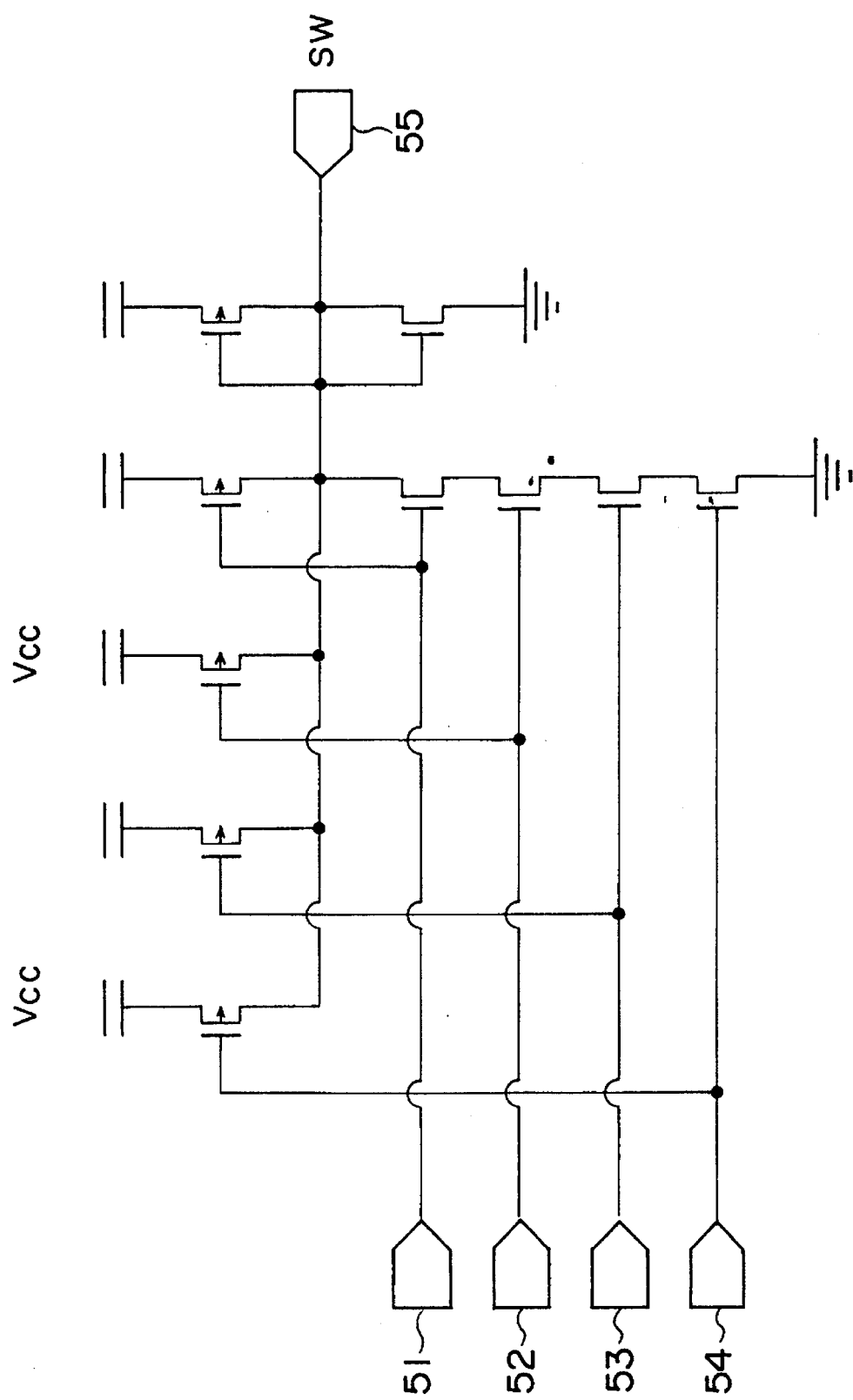
FIG. 8 is a circuit diagram showing a switching signal generating circuit.

The switching signal SW is obtained from a switching signal generating circuit shown in FIG. 8. The switching signal SW indicates whether or not the input address matches a redundant address. In this embodiment, redundant cell arrays amounting to 16 blocks (faces or fields) are provided. Hence, 16 switching signal generating circuits such as that shown in FIG. 8 are actually provided in the mask ROM.

The switching signal generating circuit shown in FIG. 8 includes transistors which are connected as shown, and terminals 51 through 55. Bits of a 4-bit address signal which is obtained by decoding the input address in an address decoder (not shown) are input to the terminals 51 through 54. A high-level switching signal SW is output from the terminal 55 only when the 4-bit address signal indicates that the correction data with respect to the block (face or field) corresponding to the switching signal generating circuit is to be used. By inputting this high-level switching signal SW to the terminal 46 of the sense amplifier 1-3 shown in FIG. 7, it is possible to output the correction data from the terminal 47.

Accordingly, this sense amplifier 1-3 operates (that is, active) when the inverted sense amplifier enable signal /CE has the low level and the switching signal SW has a low level, and outputs the regular data from the terminal 44 in this case. In this state, a high-level signal is output from the terminal 47. On the other hand, when the inverted sense amplifier enable signal /CE has the high level and the switching signal SW has the high level, the sense amplifier 1-3 outputs the correction data from the terminal 47. In this state, a high-level signal is output from the terminal 44. In addition, when the inverted sense amplifier enable signal /CE has the high level and the switching signal SW has the low level, a high-level signal is output from each of the terminals 44 and 47. In other words, the high-level signal is output from each of the two terminals 44 and 47 when the sense amplifier 1-3 does not operate (that is, inactive).

With regard to the regular data, 1 sense amplifier is provided in the mask ROM per output for each of the upper and lower addresses. In addition, with regard to the correction data, 8 sense amplifiers are provided in the mask ROM for each of the upper and lower addresses. For this reason, a logical product (AND) of the outputs of each of the sense amplifiers is obtained when determining which sense amplifier output is to be used as the output data. Because only 1 sense amplifier is actually active and the outputs of the other inactive sense amplifiers are fixed to a high level, it is possible to obtain the correct data by taking the AND of the outputs of each of the sense amplifiers. In other words, the read data is obtained from the outputs of the 16 blocks (faces or fields) of memory cell arrays when no access is made to the defective cell. On the other hand, when the correction data is to compensate for the defective cell, the read data is obtained from the correction data from the redundant cell array and the outputs of the 15 blocks (faces or fields) of memory cell arrays.

Figure 9:
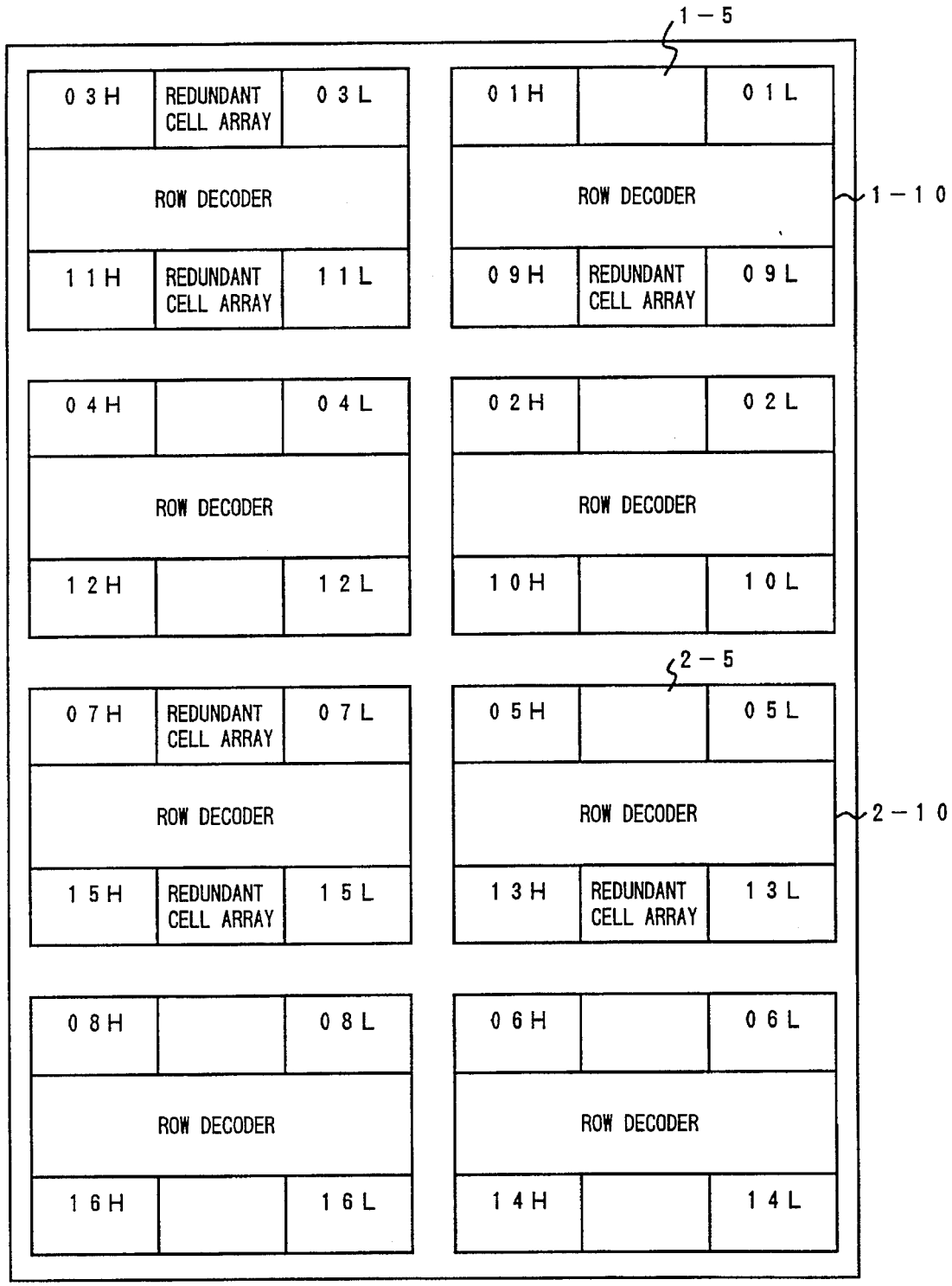
FIG. 9 is a plan view showing an embodiment of a layout of the semiconductor device shown in FIG. 3.

FIG. 9 is a plan view showing an embodiment of the layout of the mask ROM described above. In FIG. 9, those parts which are the same as those corresponding parts in FIG. 3 are designated by the same reference numerals, and a description thereof will be omitted. In addition, the illustration of the sense amplifiers, the column decoders and the peripheral circuits will be omitted in FIG. 9. The mask ROM shown in FIG. 9 is provided with memory cell arrays 01H through 16L which are divided into 32 blocks (faces or fields).

The construction of the row decoder, the memory cell, the sense amplifier and the like is not limited to those of the described embodiment. In addition, the construction of other parts of the mask ROM such as the column decoder may be the same as those of the conventional mask ROM, and a description and illustration thereof will be omitted in this specification. In addition, it is of course possible to use the sense amplifier shown in FIG. 7 as the sense amplifiers 1-1 and 2-3.

Further, the present invention is not limited to these embodiments, but various variations and modifications may be made without departing from the scope of the present invention.

What is claimed is:

1. A semiconductor memory device comprising:
    a memory cell array divided into a first memory cell array for an upper address of an input address and a second memory cell array for a lower address of the input address;
    a redundant cell array storing correction data;
    a first sense amplifier provided with respect to said first memory cell array;
    a first column decoder provided with respect to said first memory cell array;
    a second sense amplifier provided with respect to said second memory cell array; and
    a second column decoder provided with respect to said second memory cell array,
    said second sense amplifier and said second column decoder being non-selected when an access is made to said first memory cell array by said input address, and said non-selected second sense amplifier and second column decoder operating as a sense amplifier and a column decoder provided with respect to said redundant cell array to thereby output the correction data from the upper address of said redundant cell array.

2. The semiconductor memory device as claimed in claim 1, which further comprises a plurality of memory cell arrays, and wherein said first sense amplifier, said first column decoder, said second sense amplifier and said second column decoder are respectively provided with respect to said plurality of memory cell arrays.

3. The semiconductor memory device as claimed in claim 1, which further comprises a bit line provided with respect to said redundant cell array, said bit line being used in common with respect to said second memory cell array.

4. The semiconductor memory device as claimed in claim 1, which further comprises row decoder selection lines provided with respect to said redundant cell array, said row decoder selection lines being used in common with respect to said second memory cell array.

5. The semiconductor memory device as claimed in claim 1, wherein said second sense amplifier selectively outputs data from one of said second memory cell array and said redundant cell array in response to a switching signal which indicates whether or not said input address matches a redundant address.

6. The semiconductor memory device as claimed in claim 1, wherein said first and second sense amplifiers respectively output a signal which is fixed to one of two logic levels in an inactive state.

7. The semiconductor memory device as claimed in claim 2, which further comprises a bit line provided with respect to said redundant cell array, said bit line being used in common with respect to said second memory cell array.

8. The semiconductor memory device as claimed in claim 7, which further comprises row decoder selection lines provided with respect to said redundant cell array, said row decoder selection lines being used in common with respect to said second memory cell array.

9. The semiconductor memory device as claimed in claim 8, wherein said second sense amplifier selectively outputs data from one of said second memory cell array and said redundant cell array in response to a switching signal which indicates whether or not said input address matches a redundant address.

10. The semiconductor memory device as claimed in claim 9, wherein said first and second sense amplifiers respectively output a signal which is fixed to one of two logic levels in an inactive state.

\* \* \* \* \*